United States Patent
Kaida et al.

(10) Patent No.: US 10,615,331 B2
(45) Date of Patent: Apr. 7, 2020

(54) CRYSTAL VIBRATOR AND CRYSTAL VIBRATION DEVICE

(71) Applicant: Murata Manufacturing Co., Ltd., Nagaokakyo-shi, Kyoto-fu (JP)

(72) Inventors: Hiroaki Kaida, Nagaokakyo (JP); Keiichi Kami, Nagaokakyo (JP); Kazuyuki Noto, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 495 days.

(21) Appl. No.: 15/659,763

(22) Filed: Jul. 26, 2017

(65) Prior Publication Data

US 2017/0324024 A1 Nov. 9, 2017

Related U.S. Application Data

(63) Continuation of application No. PCT/JP2016/050559, filed on Jan. 8, 2016.

(30) Foreign Application Priority Data

Feb. 19, 2015 (JP) ................ 2015-030702

(51) Int. Cl.
*H03H 9/19* (2006.01)
*H03H 9/10* (2006.01)
(Continued)

(52) U.S. Cl.
CPC ............. *H01L 41/332* (2013.01); *H03H 3/02* (2013.01); *H03H 9/0519* (2013.01);
(Continued)

(58) Field of Classification Search
CPC ...... H03H 3/02; H03H 9/0519; H03H 9/1021; H03H 9/15; H03H 9/17; H03H 9/19
See application file for complete search history.

(56) References Cited

U.S. PATENT DOCUMENTS 7,608,987 B2  10/2009  Naito et al.
7,861,389 B2   1/2011  Naito et al.
(Continued)

FOREIGN PATENT DOCUMENTS

| JP | 2008-67345 A | 3/2008 |
|---|---|---|
| JP | 2008-236439 A | 10/2008 |
| JP | 2011-166364 A | 8/2011 |

OTHER PUBLICATIONS

International Search Report issued in International Application No. PCT/JP2016/050559, dated Mar. 22, 2016.
(Continued)

*Primary Examiner* — Derek J Rosenau
(74) *Attorney, Agent, or Firm* — Arent Fox LLP (57) ABSTRACT

A crystal vibrator includes an AT-cut crystal substrate with a vibration portion having a principal surface and a peripheral portion surrounding and thinner than the vibration portion. An excitation electrode is formed on the principal surface and an extension electrode is electrically connected to the excitation electrode. The vibration portion has a first short-edge side lateral surface that abuts the peripheral portion at an acute angle and a tapered lateral surface adjacent to the first short-edge side lateral surface and inclined with respect to the X axis in the XZ' plane. The tapered lateral surface abuts the peripheral portion at an angle that is greater than the angle defined by the first short-edge side lateral surface. The extension electrode extends from the excitation electrode through the tapered lateral surface to a first short-edge side in a longitudinal direction parallel to the Z' axis.

20 Claims, 6 Drawing Sheets

(51) Int. Cl.
    *H03H 9/13*     (2006.01)
    *H01L 41/332*     (2013.01)
    *H03H 3/02*     (2006.01)
    *H03H 9/05*     (2006.01)
    *H03H 3/04*     (2006.01)

(52) U.S. Cl.
    CPC ............ *H03H 9/1021* (2013.01); *H03H 9/13* (2013.01); *H03H 9/19* (2013.01); *H03H 2003/026* (2013.01); *H03H 2003/0478* (2013.01)

(56) References Cited

U.S. PATENT DOCUMENTS

| | | | |
|---|---|---|---|
| 8,084,926 B2 | 12/2011 | Naito et al. | |
| 8,710,715 B2 * | 4/2014 | Naito | H03H 3/04 310/320 |
| 9,496,480 B2 * | 11/2016 | Naito | H01L 41/0825 |
| 2008/0036335 A1 | 2/2008 | Naito et al. | |
| 2009/0300894 A1 | 12/2009 | Naito et al. | |
| 2011/0068660 A1 | 3/2011 | Naito et al. | |
| 2011/0203083 A1 * | 8/2011 | Sasaki | H03H 3/02 29/25.35 |

OTHER PUBLICATIONS

Written Opinion of the International Searching Authority issued in International Application No. PCT/JP2016/050559, dated Mar. 22, 2016.

\* cited by examiner

CRYSTAL VIBRATOR AND CRYSTAL VIBRATION DEVICE

CROSS-REFERENCE TO RELATED APPLICATIONS

The present application is a continuation of PCT/JP2016/050559 filed Jan. 8, 2016, which claims priority to Japanese Patent Application No. 2015-030702, filed Feb. 19, 2015, the entire contents of each of which are incorporated herein by reference.

TECHNICAL FIELD

The present disclosure relates to a crystal vibrator and a crystal vibration device.

BACKGROUND

As a piezoelectric vibration element used in oscillation devices, bandpass filters, and the like, a crystal vibrator that uses vibration in a thickness shear mode as main vibration is widely used. As such a crystal vibrator, for example, a mesa-structure is known in which, in order to confine the vibration energy of vibration in a thickness shear mode, an etching process is performed to make a vibration portion thicker than a peripheral portion of the vibration portion. The mesa-structure includes excitation electrodes on both principal surfaces of the vibration portion, and extension electrodes electrically connected to the excitation electrodes. In this case, the extension electrodes extend through a step formed by the vibration portion and the peripheral portion.

Typically, the cross-sectional shape of the step formed by the vibration portion and the peripheral portion is determined depending on the orientation of the crystallographic axes of a crystal. An electrode may be broken on the side on which the angle formed by a lateral surface of the vibration portion and a surface of the peripheral portion is an acute angle. The extending direction of the electrodes may be limited, or it may be difficult to maintain stable quality in view of reliability of electrical connection.

On the other hand, for example, a configuration like the one in Patent Document 1 (identified below) is known in which an electrode electrically connected to the excitation electrode extends to the side on which the angle formed by the lateral surface of the vibration portion and the surface of the peripheral portion is an obtuse angle (toward first long-edge side in transverse direction). With this configuration, the electrode extends outward over the excitation electrode in the width direction, and the crystal vibrator may not be reduced in size.

Patent Document 1: Japanese Unexamined Patent Application Publication No. 2008-236439.

SUMMARY

The present disclosure is provided in light of such situations described above. It is an object of the present disclosure to improve reliability of electrical connection while the size of the vibration device is reduced.

Accordingly, a crystal vibrator according to an exemplary aspect is provided that includes an AT-cut crystal substrate with a crystallographic axes of a crystal include an X axis, a Y axis, and a Z axis and a Z' axis is an axis obtained by rotating the Z axis around the X axis by a predetermined angle. Moreover, the substrate has a principal surface, a surface parallel to a plane specified by the X axis and the Z' axis, the AT-cut crystal substrate including a vibration portion and a peripheral portion provided to surround the vibration portion and being thinner than the vibration portion. An excitation electrode formed on the principal surface and an extension electrode electrically connected to the excitation electrode. The AT-cut crystal substrate has a longitudinal direction and a transverse direction, with the longitudinal direction being parallel to the Z'-axis direction the transverse direction being parallel to the X-axis direction. The vibration portion has a first short-edge side lateral surface abutting the peripheral portion on a first short-edge side in the longitudinal direction at an acute angle θ1, and a tapered lateral surface formed to be adjacent to the first short-edge side lateral surface and inclined with respect to the X axis in a view of the plane specified by the X axis and the Z' axis. The tapered lateral surface abuts the peripheral portion at an angle θ' being larger than the angle θ1. The extension electrode is formed to extend from the excitation electrode through at least a portion of the tapered lateral surface toward the first short-edge side in the longitudinal direction.

With this configuration, the extension electrode is formed to extend through at least the portion of the tapered lateral surface of the vibration portion toward the first short-edge side in the longitudinal direction. Since the extension electrode can be formed to extend at a relatively gentle angle, the electrode can be prevented from being broken, and the stable quality can be maintained in view of the reliability of electrical connection without limiting the extending direction of the electrode. Moreover, it is not necessary to particularly widely form the region of the peripheral portion of the crystal substrate, and hence the crystal vibrator can be reduced in size. Accordingly, the reliability of electrical connection can be improved while the size is reduced.

In the above-described crystal vibrator, the vibration portion may have a second short-edge side lateral surface abutting the peripheral portion on a second short-edge side in the longitudinal direction, and the tapered lateral surface may be formed to be adjacent to the first short-edge side lateral surface and the second short-edge side lateral surface.

In the above-described crystal vibrator, the vibration portion may have a first long-edge side lateral surface abutting the peripheral portion on a first long-edge side in the transverse direction, and the tapered lateral surface may be formed to be adjacent to the first short-edge side lateral surface and the first long-edge side lateral surface.

In the above-described crystal vibrator, the extension electrode may be formed on an entire surface of the tapered lateral surface, and may be formed to have a width larger than a width of the tapered lateral surface so as to reach a portion of the first short-edge side lateral surface and a portion of the first long-edge side lateral surface.

In the above-described crystal vibrator, the AT-cut crystal substrate may have a front surface and a rear surface, and an external shape of the vibration portion on the front surface may be axially symmetrical to an external shape of the vibration portion on the rear surface about the Z' axis in the view of the plane specified by the X axis and the Z' axis.

A crystal device according to another exemplary aspect includes a base member; a lid member connected to the base member to form a hermetically sealed inner space, and the above-described crystal vibrator housed in the inner space.

With the above-described configuration, since the above-described crystal vibrator is provided, the reliability of electrical connection can be improved while the size is reduced.

According to the present disclosure, the reliability of electrical connection can be improved while the size is reduced.

DETAILED DESCRIPTION

An exemplary embodiment of the preset disclosure is described below. In the following drawings, the same or similar components are expressed with the same or similar reference signs. The drawings are merely examples, and the dimensions and shapes of respective portions are schematically illustrated. The technical scope of the present invention should not be interpreted in a manner limited to the embodiment.

Figure 1A:
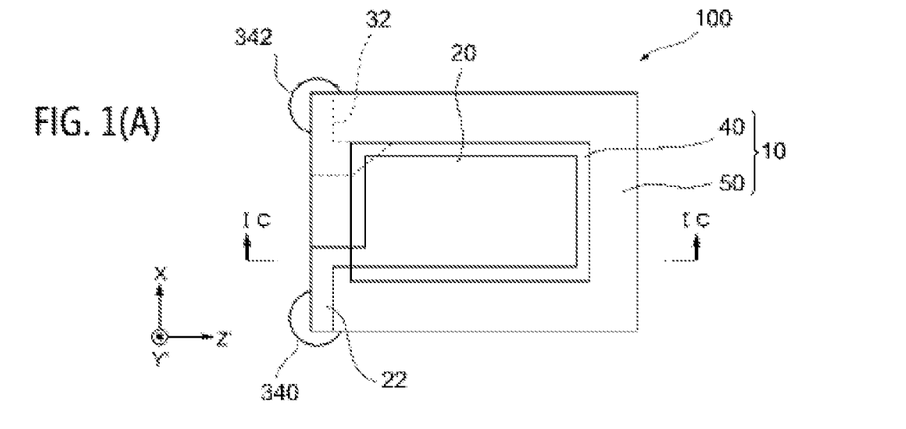
FIG. 1A to FIG. 1C illustrate a crystal vibrator according to an exemplary embodiment.
Figure 1B:
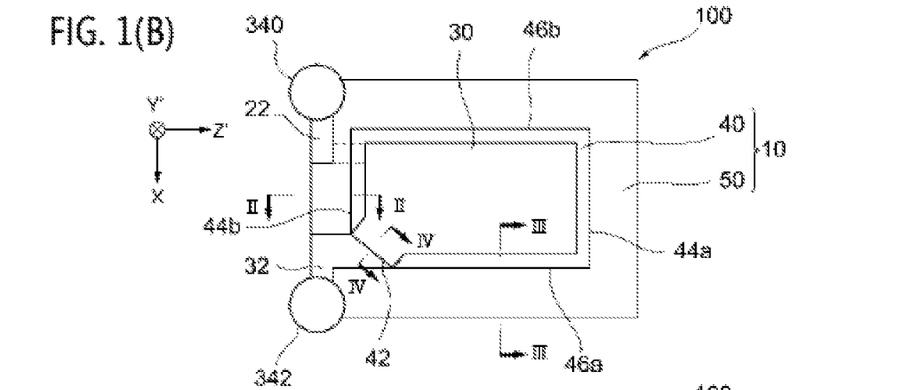
Figure 1C:
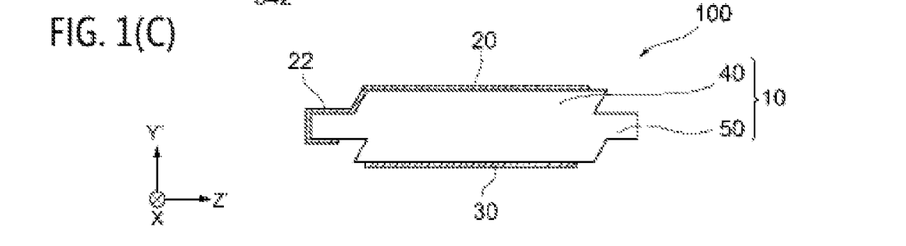

FIG. 1A to FIG. 1C are illustrations for explaining a crystal vibrator according to this embodiment. To be specific, FIG. 1A and FIG. 1B are plan views. FIG. 1C is a cross-sectional view taken along line IC-IC in FIG. 1A.

A crystal vibrator 100 according to this embodiment includes a crystal substrate 10, and excitation electrodes 20 and 30 formed on the crystal substrate 10.

The crystal substrate 10 is made of a crystal formed by AT-cut. When the crystallographic axes of an artificial crystal include an X axis, a Y axis, and a Z axis and a Y' axis and a Z' axis are axes obtained by rotating the Y axis and the Z axis around the X axis in a direction from the Y axis to the Z axis by 35 degrees and 15 minutes, the AT-cut crystal substrate 10 is cut off to have, as principal surfaces, surfaces parallel to a plane defined by the X axis and the Z' axis (hereinafter, referred to as "XZ' plane," a plane specified by other axes is also called in a similar manner). The crystal vibrator using the AT-cut crystal substrate has very high frequency stability in a wide temperature range and good ageing characteristics, and can be manufactured at low cost. Also, the AT-cut crystal vibrator uses vibration in a thickness shear mode as main vibration in many cases.

According to the exemplary embodiment, the crystal substrate 10 has a longitudinal direction parallel to the Z'-axis direction, a transverse direction parallel to the X direction, and a thickness direction parallel to the Y'-axis direction. The crystal substrate 10 has a substantially rectangular shape in the XZ' plane as illustrated in FIG. 1A. FIG. 1A is a plan view on the positive-Y'-axis-direction side (front surface side of crystal substrate). FIG. 1B is a plan view on the negative-Y'-axis-direction side (rear surface side of crystal substrate).

The crystal substrate 10 includes a vibration portion 40 that vibrates in the thickness shear mode, and a peripheral portion 50 provided to surround the entire circumference of the vibration portion 40. As illustrated in FIG. 1C, the vibration portion 40 is thinner than the peripheral portion 50. Also, the excitation electrode 20 is formed on a positive-Y'-axis-direction side principal surface of the vibration portion 40, and the excitation electrode 30 is formed on a negative-Y'-axis-direction side principal surface. As illustrated in FIG. 1A and FIG. 1B, the excitation electrodes 20 and 30 may be formed to have external shapes smaller than the region of the vibration portion 40 so that a space is provided between each of the excitation electrodes 20 and 30 and the outer edge of the vibration portion 40. Alternatively, the excitation electrodes 20 and 30 may be formed to cover the entire regions of the respective principal surfaces of the vibration portion 40. The excitation electrodes 20 and 30 are arranged as a pair of electrodes so as to entirely overlap each other in the XZ' plane.

An extension electrode 22 electrically connected to the excitation electrode 20, and an extension electrode 32 electrically connected to the excitation electrode 30 are formed on the crystal substrate 10. As illustrated in FIG. 1A, the extension electrode 22 extends toward the negative-Z'-axis-direction side short edge, in the longitudinal direction of the crystal substrate 10, on the positive-Y'-axis-direction side. Then, the extension electrode 22 extends through a lateral surface of the peripheral portion 50 to reach the negative-Y'-axis-direction side (see FIG. 1B and FIG. 1C). As illustrated in FIG. 1B, the extension electrode 32 extends toward the negative-Z'-axis-direction side short edge, in the longitudinal direction of the crystal substrate 10, on the negative-Y'-axis-direction side. The extension electrodes 22 and 32 respectively have connection electrodes along the negative-Z'-axis-direction side short edge. The connection electrodes respectively have conductive adhesives 340 and 342. The conductive adhesives 340 and 342 provide electrical continuity between the excitation electrodes 20, 30 and the outside, on the negative-Y'-axis-direction side and the negative-Z'-axis-direction side.

The base layer of the respective electrodes including the excitation electrodes 20 and 30 may be formed, for example, of a chromium (Cr) layer, and a gold (Au) layer may be formed on a surface of the chromium layer. These materials are not particularly limited.

Figure 2:
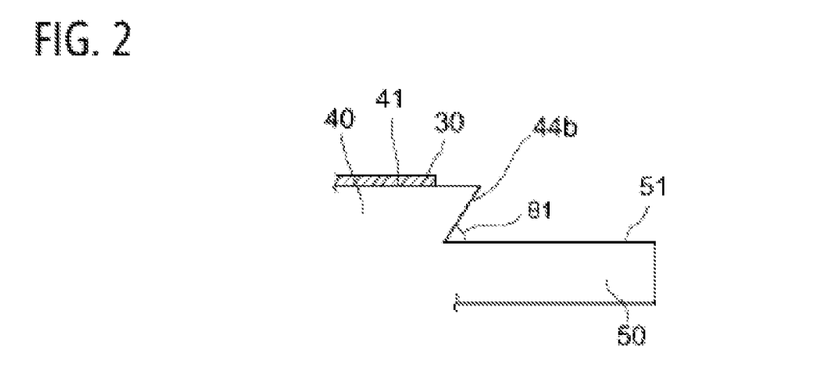
FIG. 2 is a cross-sectional view taken along line II-II in FIG. 1(B).
Figure 3:
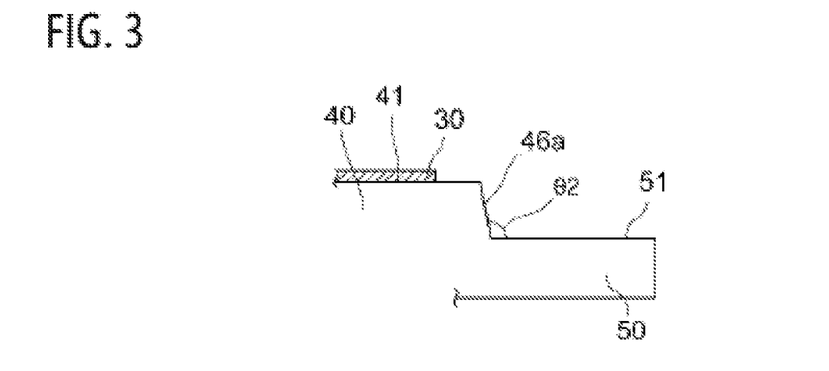
FIG. 3 is a cross-sectional view taken along line III-III in FIG. 1(B).
Figure 4:
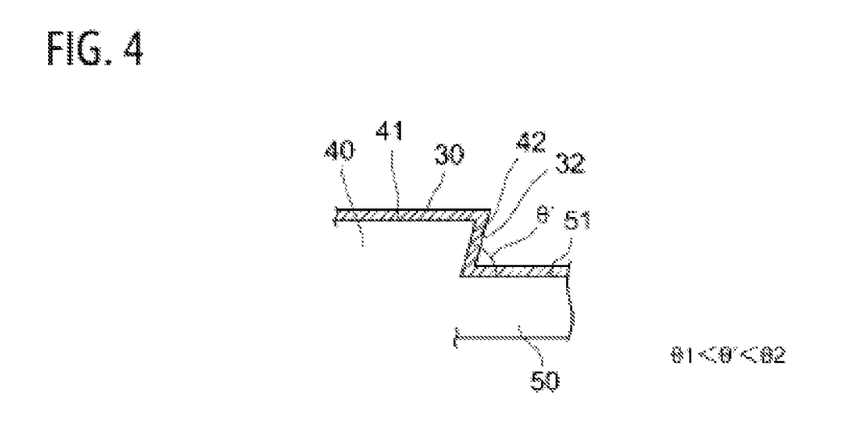
FIG. 4 is a cross-sectional view taken along line IV-IV in FIG. 1(B).

The cross-sectional shape of the crystal substrate 10 is described next with reference to FIGS. 2 to 4. FIGS. 2 to 4 respectively correspond to a cross-sectional view taken along line II-II, a cross-sectional view taken along line III-III, and a cross-sectional view taken along line IV-IV in FIG. 1B.

The crystal substrate 10 is typically formed by wet etching. Hence, the crystal substrate 10 is formed so that the planar shape in the XZ' plane follows the mask shape, and on the other hand, the cross-sectional shape perpendicular to the XZ' plane depends on the etching condition and the orientation of the crystallographic axes of the crystal substrate. That is, the cross-sectional shape of the step formed by the vibration portion 40 and the peripheral portion 50 is a shape almost perpendicular to the principal surfaces in the XY' plane included in the cross sections perpendicular to the XZ' plane, and on the other hand, the cross-sectional shape of the step is a shape relatively largely inclined with respect to the principal surfaces in the Y'Z' plane as illustrated in FIG. 1C. Therefore, the lateral surface of the vibration portion 40 abuts the peripheral portion 50 at a relatively large obtuse angle at the edge on the positive-Y'-axis-direction side and the negative-Z'-axis-direction side. In contrast, the lateral surface of the vibration portion 40 abuts the peripheral portion 50 at a relatively large acute angle at the edge on the negative-Y'-axis-direction side and the negative-Z'-axis-direction side. The electrode extending from the excitation electrode on the negative-Y'-axis-direction side may be broken.

In this embodiment, a tapered lateral surface 42 is formed at the vibration portion 40, on the negative-Y'-axis-direction side. Preferably, the extension electrode 32 extends through at least a portion of the tapered lateral surface 42 and extends toward the negative-Z'-axis-direction side short edge.

To be specific, as illustrated in FIG. 1B, the vibration portion 40 includes, on the rear surface side of the crystal substrate 10, a second short-edge side lateral surface 44a on the positive-Z'-axis-direction side, a first short-edge side lateral surface 44b on the negative-Z'-axis-direction side, a first long-edge side lateral surface 46a on the positive-X-axis-direction side, a second long-edge side lateral surface 46b on the negative-X-axis-direction side, and the tapered lateral surface 42 formed to be adjacent to the first short-edge side lateral surface 44b and the first long-edge side lateral surface 46a and inclined with respect to the X axis in the XZ' plane. The plurality of lateral surfaces of the vibration portion 40 are connected to a principal surface 41 of the vibration portion 40 and a principal surface 51 of the peripheral portion 50 (see FIGS. 2 to 4). Also, in the example illustrated in FIG. 1B, the vibration portion 40 of the crystal substrate 10 has a pentagonal planar shape from which a corner part is cut in the XZ' plane.

If the crystal substrate 10 is formed by wet etching, the cross-sectional shape depends on the orientation of the crystallographic axes of the crystal as described above. As illustrated in FIG. 2, the first short-edge side lateral surface 44b on the negative-Z'-axis-direction side abuts the principal surface 51 of the peripheral portion 50 at an acute angle θ1. The angle formed between the lateral surface of the vibration portion 40 and the principal surface 51 of the peripheral portion 50 increases as the orientation is changed from a line parallel to the X axis to a line parallel to the Z' axis. As illustrated in FIG. 3, the first long-edge side lateral surface 46a abuts the principal surface 51 of the peripheral portion 50 at an angle θ2, where θ1<θ2. That is, if the tapered lateral surface 42 is formed by wet etching, the angle θ' formed between the tapered lateral surface 42 and the principal surface 51 of the peripheral portion 50 is determined in a range of θ1<θ'<θ2, on the basis of various factors, such as the angle of the tapered surface (the inclination angle with respect to the X axis in the XZ' plane), the height of the step (i.e., the height from the principal surface 51 of the peripheral portion 50 to the principal surface 41 of the vibration portion 40), and the etching condition.

To be specific, the angle θ1 approximates to the angle 35°15' from the Z' axis by AT-cut (i.e., original Z axis) according to the exemplary embodiment. For example, the angle θ1 may be in a range of 33°<θ1<38°. The angle θ2 approximates to 90°. For example, the angle θ2 may be in a range of 85°<θ2<95°. The angle θ2 exceeds 90° and becomes larger if the etching time is long. Also, the angle θ' depends on the inclination angle of the tapered surface. For example, the angle θ' may be in a range of 50°<θ'<80°. These angles become smaller as the etching time is longer in comparison with the case of the short etching time.

The angle θ' of the tapered lateral surface 42 may be desirably formed in a range of θ1<θ'<θ2 by using another alternative or additional method.

The excitation electrodes and extension electrodes may be formed simultaneously or at different timings, for example, by sputtering using an additional metal mask after a mask used for wet etching is removed. Alternatively, a mask for wet-etching the crystal substrate may be formed by sputtering, the mask may serve as the excitation electrodes, and an extension electrode may be added, for example, by sputtering if required. In this case, the excitation electrode is formed to cover the entire region of the principal surface of the vibration portion. A conductive film may be further additionally formed on the mask formed by sputtering, and the conductive film may serve as an excitation electrode.

In the exemplary embodiment described above, the extension electrode 32 formed on the negative-Y'-axis-direction side included in the extension electrodes 22 and 32 is formed to extend through at least a portion of the tapered lateral surface 42 toward the negative-Z'-axis-direction side short edge. That is, the extension electrode 32 extends to the principal surface 51 of the peripheral portion 50 at the angle θ' being larger than the acute angle θ1. Hence, even if the step is formed by the vibration portion 40 and the peripheral portion 50, the extension electrode 32 is formed to extend at a relatively gentle angle. The electrode is prevented from being broken, and the stable quality can be maintained in view of the reliability of electrical connection. Moreover, with this configuration, it is not necessary to particularly widely form the region of the peripheral portion 50 of the crystal substrate 10, and hence the crystal vibrator 100 can be reduced in size. Hence, the reliability of electrical connection can be improved while the size is reduced.

In the above description, the specification of the crystallographic axes (X, Y', Z') of the crystal and the positive and negative directions is merely an example, and this should not be interpreted in a limited manner when the configuration of the crystal vibrator is to be understood. For example, a crystal substrate obtained by rotating the crystallographic axes (X, Y', Z') of a crystal by 180° around the X axis (the positive and negative directions of the respective axes are oppositely arranged) has a similar shape (the shapes of the acute and obtuse angles of lateral surfaces). In this case, the contents described in this embodiment may be applied to the configuration.

Figure 5:
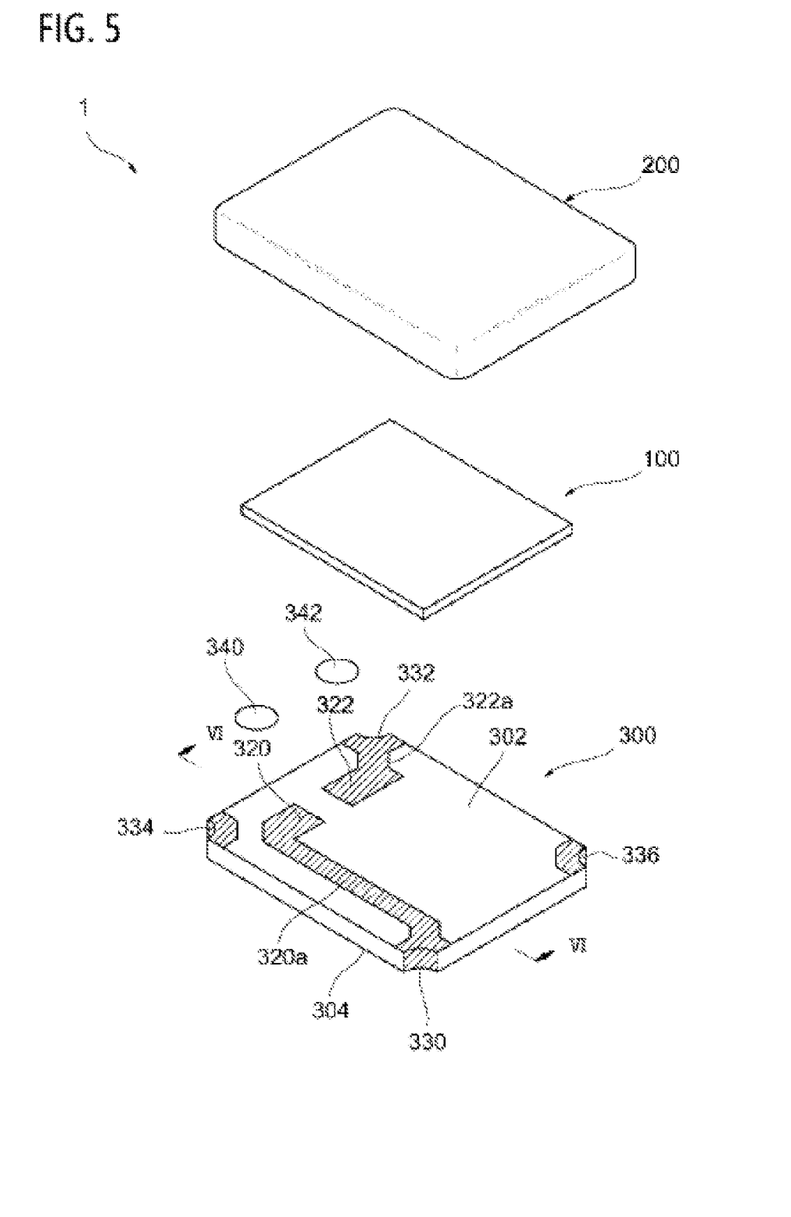
FIG. 5 is a schematic perspective view for a crystal vibration device according to an exemplary embodiment.
Figure 6:
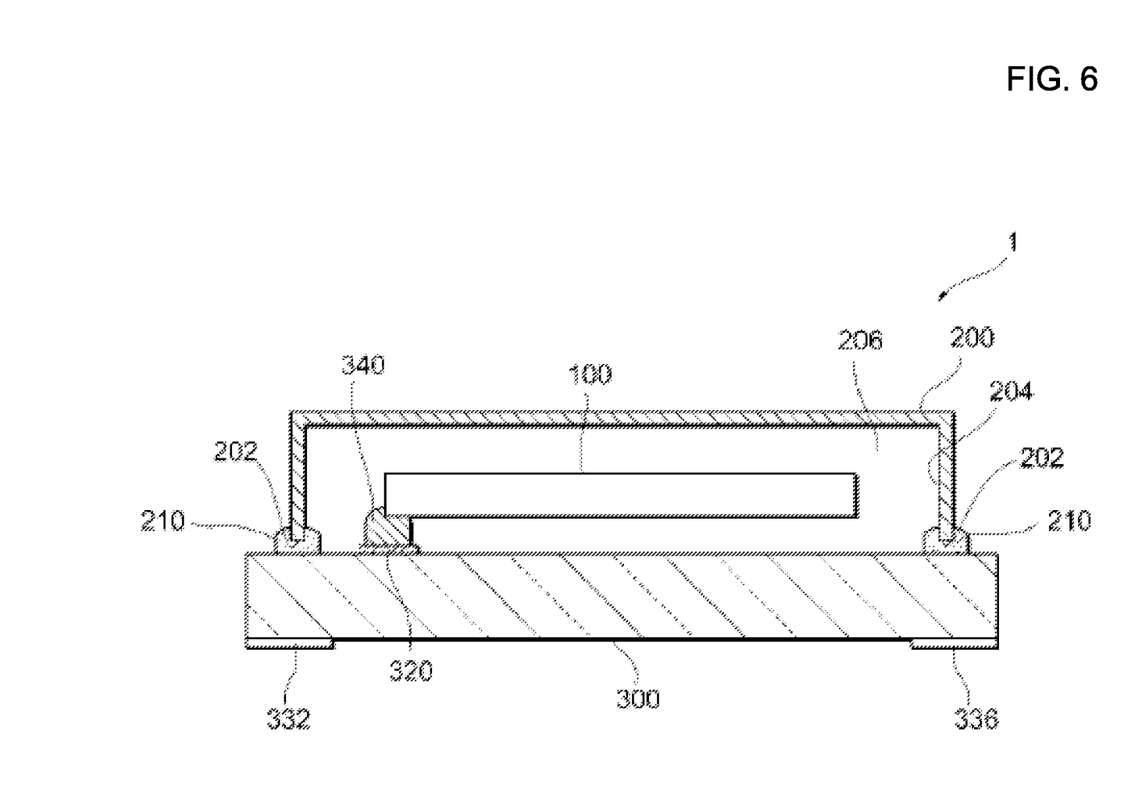
FIG. 6 is a cross-sectional view for a crystal vibration device according to an exemplary embodiment.

A crystal vibration device according to this embodiment is described next with reference to FIGS. 5 and 6. FIG. 5 is an exploded perspective view of the crystal vibration device according to this embodiment. FIG. 6 is a view taken along line VI-VI in FIG. 5. The crystal vibrator 100 is schematically illustrated in FIGS. 5 and 6; however, the details of the crystal vibrator 100 are as described above.

A crystal vibration device 1 according to this embodiment includes the above-described crystal vibrator 100, a lid member 200, and a base member 300. The lid member 200 and the base member 300 are a case or a package for housing the crystal vibrator 100.

The lid member 200 has a recess portion 204 being open to face a first surface 302 of the base member 300. Also, the lid member 200 has an opening edge portion 202 of the recess portion 204. The lid member 200 may be formed of any of a metal material, an insulating material, and a composite material of these materials. The external shape of the lid member 200, the shape of the recess portion 204, and the form of the opening edge portion 202 are not particularly limited. For example, the opening edge portion may be a flange portion that protrudes from the opening edge in a direction from the center of the opening of the recess portion toward the opening edge.

The base member 300 has a substantially rectangular external shape. The crystal vibrator 100 is provided on the first surface 302 of the base member 300. The base member 300 may be formed of ceramic. As illustrated in FIG. 6, the lid member 200 and the base member 300 are joined to each other. Thus the crystal vibrator 100 is hermetically sealed in an inner space (cavity) 206 enclosed by the recess portion 204 of the lid member 200 and the base member 300. Both the lid member 200 and the base member 300 are joined to each other by a desirable adhesive material (for example, low-melting glass or resin adhesive) 210. As illustrated in FIG. 6, the crystal vibrator 100 is supported by the lid member 200 and the base member 300 so that a first end of the crystal vibrator 100 having connection electrodes (provided with the conductive adhesives 340 and 342) serve as a fixed end. A second end of the crystal vibrator 100 is a free end.

As illustrated in FIG. 5, the base member 300 includes outer electrodes 330, 332, 334, and 336 formed at respective corners. The outer electrodes 330 to 336 are continuously formed to extend from the first surface 302 on which the crystal vibrator 100 is mounted, through lateral surfaces of the base member 300, to a second surface 304 (the surface opposite to the first surface 302) of the base member 300. To be more specific, the base member 300 has lateral surfaces (cut portions) formed by cutting portions of the respective corners in cylindrical curved surfaces (or castellation shapes). The outer electrodes 330 to 336 are continuously formed to extend from the first surface 302 on which the crystal vibrator 100 is mounted, through the lateral surfaces formed by cutting in such cylindrical curved shapes, to the second surface 304 of the base member 300. The shapes of the corners of the base member 300 are not limited to the above-described shapes.

According to an exemplary embodiment, the outer electrode 330 that is one of the plurality of outer electrodes 330 to 336 formed on the base member 300 is electrically connected to a connection electrode 320 formed on the first surface 302 via an extension electrode 320a. The outer electrode 332 that is another one is electrically connected to the connection electrode 322 formed on the first surface 302 via an extension electrode 322a. The residual two outer electrodes 334 and 336 are dummy electrodes that are not electrically connected to the connection electrodes. Also, the connection electrodes 320 and 322 of the base member 300 are electrically connected to the connection electrode (see FIG. 1B) of the crystal vibrator 100 via the conductive adhesives 340 and 342. The two outer electrodes 330 and 332 electrically connected to the crystal vibrator 100 may be provided at opposite positions in a plan view of the base member 300.

It is noted that with regard to the connection electrodes and outer electrodes, the number, arrangement, and pattern shape of these electrodes are not particularly limited, and may be designed properly.

Since the outer electrodes 330 to 336 are formed on the base member 300 in this way, the electrical continuity can be provided from the first surface 302 on which the crystal vibrator 100 is provided to the second surface 304 on the mount surface side of the crystal vibration device 1. In such a crystal vibration device 1, by applying an alternating voltage between the pair of excitation electrodes of the crystal vibrator 100 via the outer electrodes 330 and 332, the crystal substrate is vibrated in the thickness shear mode, and resonance characteristics by the vibration can be obtained.

Since the crystal vibration device 1 according to this embodiment includes the above-described crystal vibrator 100, the reliability of electrical connection can be improved while the size is reduced.

The exemplary embodiment may be modified into various forms and applied to the invention. Respective modifications for the crystal vibrator according to this embodiment are described below with reference to FIGS. 7 to 9. In the following description, the points different from the configuration of the above-described embodiment are described.

Figure 7:
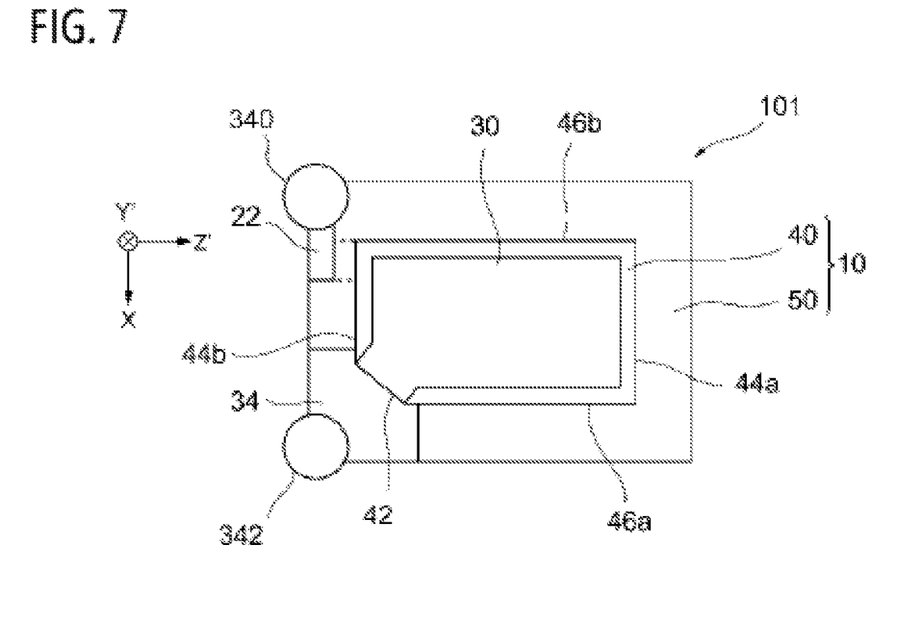
FIG. 7 is an illustration for a crystal vibrator according to a modification of the exemplary embodiment.

FIG. 7 is a plan view (a plan view on the rear surface side of a crystal substrate) of a crystal vibrator 101 according to a modification of the embodiment. The configuration of an extension electrode 34 in this modification differs from that in the aforementioned embodiment. That is, the negative-Y'-axis-direction side extension electrode 34 is formed on the entire surface of the tapered lateral surface 42 of the vibration portion 40, and is formed to have a width larger than the width of the tapered lateral surface 42 so as to reach a portion of the first short-edge side lateral surface 44b and a portion of the first long-edge side lateral surface 46a of the vibration portion 40. That is, the portion of the extension electrode 34 is formed to extend through the first short-edge side lateral surface 44b and reach the peripheral portion 50 at the angle θ1, another portion of the extension electrode 34 is formed to extend through the tapered lateral surface 42 and reach the peripheral portion 50 at the angle θ', and the residual portion is formed to extend through the first long-edge side lateral surface 46a and reach the peripheral portion 50 at the angle θ2. With this configuration, the portion of the extending electrode 34 extends to reach the peripheral portion 50 at a relatively gentle angle (i.e., angle θ'). The electrode can be prevented from being broken.

Figure 8:
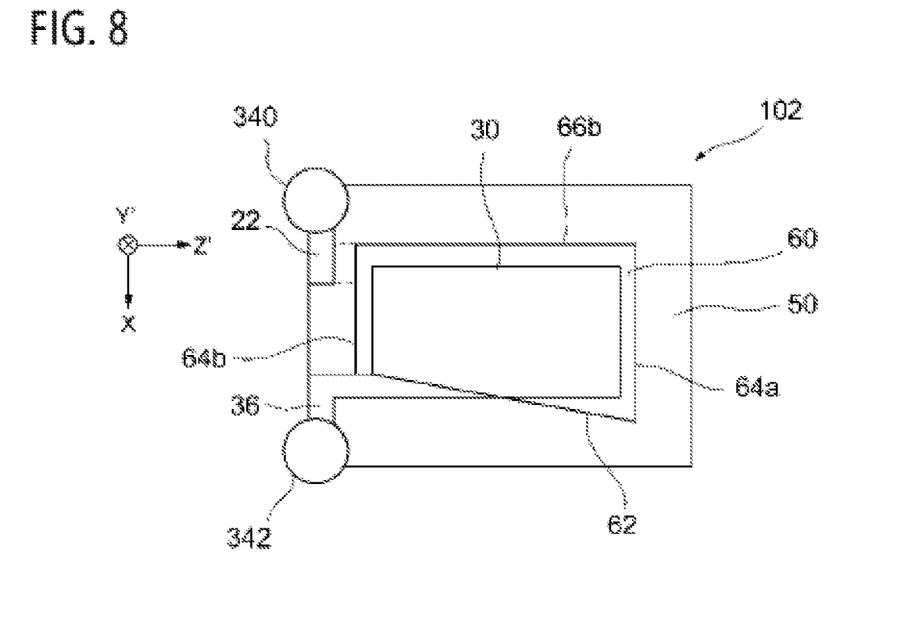
FIG. 8 is an illustration for a crystal vibrator according to another modification of the exemplary embodiment.

FIG. 8 is a plan view (a plan view on the rear surface side of a crystal substrate) of a crystal vibrator 102 according to another modification of the embodiment. The configurations of a vibration portion 60 and an extension electrode 36 differ from those of the aforementioned embodiment. That is, the vibration portion 60 includes a second short-edge side lateral surface 64a on the positive-Z'-axis-direction side, a first short-edge side lateral surface 64b on the negative-Z'-axis-direction side, a second long-edge side lateral surface 66b on the negative-X-axis-direction side, and a tapered lateral surface 62 formed to be adjacent to the first short-edge side lateral surface 64b and the second short-edge side lateral surface 64a and inclined with respect to the X axis in the XZ' plane. In the example illustrated in FIG. 8, the vibration portion 60 of the crystal substrate has a quadrangular planar shape in the XZ' plane. The extension electrode 36 is formed at a portion of the tapered lateral surface 62 formed to extend from the second short-edge side lateral surface 64a to the first short-edge side lateral surface 64b (a portion on the negative-Z'-axis-direction side). Alternatively, the extension electrode 36 may be formed on the entire surface of the tapered lateral surface 62. With this configuration, the extending electrode 36 extends to and reaches the peripheral portion 50 at a relatively gentle angle (i.e., angle θ'). The electrode can be prevented from being broken.

Figure 9:
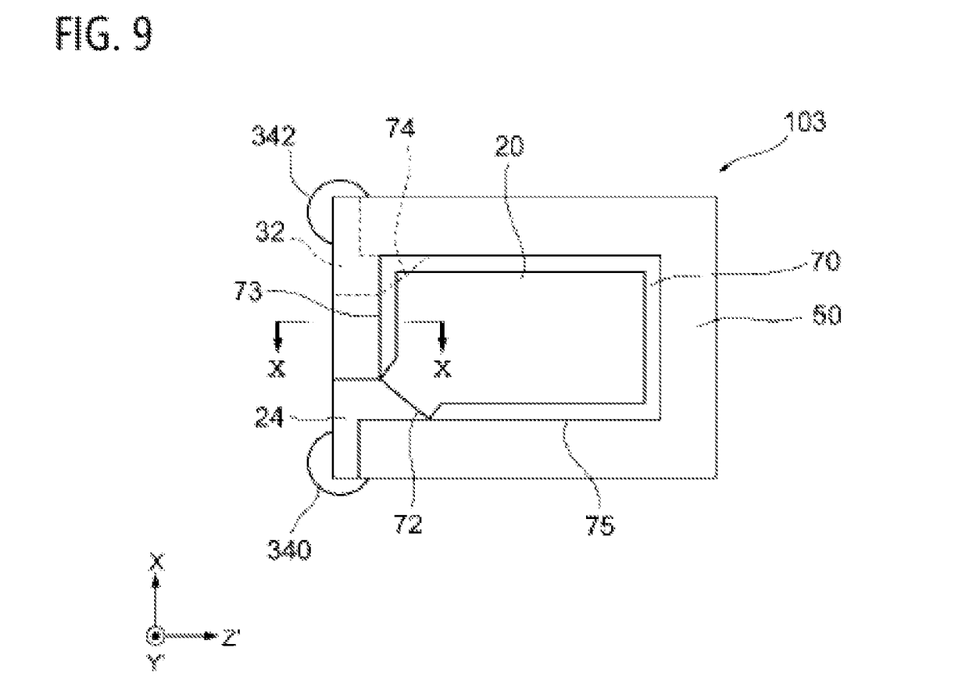
FIG. 9 is an illustration for a crystal vibrator according to still another modification of the exemplary embodiment.
Figure 10:
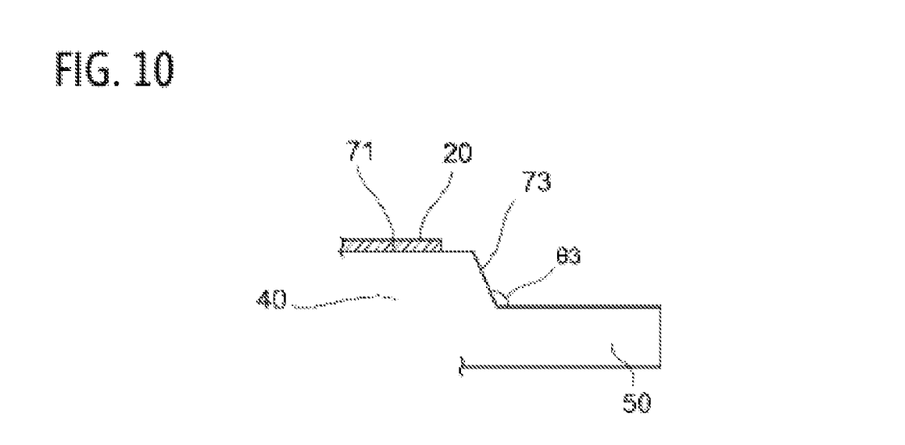
FIG. 10 is a cross-sectional view taken along line X-X in FIG. 9.

FIG. 9 is a plan view of a crystal vibrator 103 according to still another modification of this embodiment (a plan view on the front surface side of a crystal substrate). FIG. 10 is a cross-sectional view taken along line X-X in FIG. 9. In this modification, a tapered lateral surface is also formed at a vibration portion on the front surface side of the crystal substrate in addition to the configuration of the tapered lateral surface on the rear surface side of the crystal substrate described above. To be specific, on the rear surface side of the crystal substrate, a vibration portion 70 has a tapered lateral surface 74. An extension electrode 32 is formed to extend through at least a portion of the tapered lateral surface 74 toward the negative-Z'-axis-direction side short edge. The vibration portion 70 also has a tapered lateral surface 72 on the front surface side of the crystal substrate. An extension electrode 24 is formed to extend through at least a portion of the tapered lateral surface 72 toward the negative-Z'-axis-direction side short edge. That is, the external shape of the vibration portion 70 on the front surface is axially symmetrical to the external shape of the vibration portion 70 on the rear surface about the Z' axis. The configuration of the tapered lateral surface 74 on the rear surface side is equivalent to the configuration of the above-described tapered lateral surface 42. The tapered lateral surface 74 abuts the peripheral portion 50 at the above-described angle θ'. In contrast, the crystal axes of the tapered lateral surface 72 on the front surface side of the crystal substrate are rotated by 180° around the X axis with respect to the tapered lateral surface 74. As illustrated in FIG. 10, a short-edge side lateral surface 73 being adjacent to the tapered lateral surface 72 abuts the peripheral portion 50 at an obtuse angle θ3, where θ2<θ3. The adjacent long-edge side lateral surface 75 illustrated in FIG. 9 abuts the peripheral portion 50 at the same angle as the angle θ2 illustrated in FIG. 3. That is, if it is assumed that the angle at which the tapered lateral surface 72 abuts the peripheral portion 50 is an angle θ", with the angle θ" being in a range of θ2<θ"<θ3. In this case, the angle θ3 approximates to the angle 144°45' from the Z' axis by AT-cut (i.e., original Z axis). For example, the angle θ3 may be in a range of 142°<θ3<147°. Also, the angle θ" depends on the inclination angle of the tapered surface. For example, the angle θ" may be in a range of 100°<θ"<130°. With this modification, in addition to preventing the breakage of the electrode, the step of forming the electrodes is easily performed because the crystal substrate has the same configuration on the front surface and the rear surface.

The above-described respective embodiments are provided for easier understanding of the present disclosure, and are not for interpreting the present invention in a limited manner. The exemplary embodiments may be modified and improved without departing from the idea and includes equivalents. That is, the exemplary embodiments include, within their scope, a configuration obtained by those skilled in the art properly adding a change in design to any of the aforementioned embodiments as long as the resultant has the characteristics of the present disclosure. For example, respective elements, their arrangement, materials, conditions, shapes, sizes, and so forth in any of the aforementioned embodiments are not limited to those exemplified, and may be properly changed. The respective elements included in different ones of the aforementioned embodiments may be combined as far as technically possible. The exemplary embodiments can include the combination as long as the combination has the characteristics of the present disclosure.

REFERENCE SIGNS LIST 1 crystal vibrator
10 crystal substrate
30 excitation electrode
32 extension electrode
40 vibration portion
42 tapered lateral surface
44a second short-edge side lateral surface
44b first short-edge side lateral surface
46a first long-edge side lateral surface
46b second long-edge side lateral surface
50 peripheral portion
100 crystal vibrator
200 lid member
300 base member

The invention claimed is:
1. A crystal vibrator, comprising:
an AT-cut crystal substrate having a crystallographic axes including an X axis, a Y axis, and a Z axis and having a Z' axis that is obtained by rotating the Z axis around the X axis by a predetermined angle greater than 0°, the AT-cut crystal substrate having a principal surface that is parallel to a plane defined by the X axis and the Z' axis;
an excitation electrode disposed on the principal surface of the AT-cut crystal substrate; and
an extension electrode electrically connected to the excitation electrode,
wherein the AT-cut crystal substrate includes a vibration portion and a peripheral portion surrounding the vibration portion and having a thickness less than the vibration portion,
wherein the AT-cut crystal substrate has a longitudinal direction parallel to the Z'-axis direction and a transverse direction parallel to the X-axis direction,
wherein the vibration portion has a first edge side lateral surface abutting the peripheral portion at an acute angle θ1 at a first side of the AT-cut crystal substrate, and a tapered lateral surface adjacent to the first edge side lateral surface and angled relative to the X axis in a view of the plane defined by the X axis and the Z' axis,
wherein the tapered lateral surface abuts the peripheral portion at an angle θ' that is larger than the angle θ1, and
wherein the extension electrode extends from the excitation electrode and is disposed on at least a portion of the tapered lateral surface extending to the first side of the AT-cut crystal substrate.
2. The crystal vibrator according to claim 1, wherein the predetermined angle is 35°15'.
3. The crystal vibrator according to claim 1, wherein the angle θ1 is in a range of 33°<θ1<38°.
4. The crystal vibrator according to claim 1, wherein the angle θ' is in a range of 50°<θ'<80°.
5. The crystal vibrator according to claim 1,
wherein the vibration portion has a second edge side lateral surface abutting the peripheral portion at a second side of the AT-cut crystal substrate that is opposed to the first side of the AT-cut crystal substrate, and
wherein the tapered lateral surface is adjacent to the first edge side lateral surface and the second edge side lateral surface of the vibration portion.
6. The crystal vibrator according to claim 1,
wherein the vibration portion has a second edge side lateral surface abutting the peripheral portion at a second side of the AT-cut crystal substrate that extends in a direction perpendicular to the first side of the AT-cut crystal substrate, and
wherein the tapered lateral surface is disposed between to the first edge side lateral surface and the second edge side lateral surface of the vibration portion.

7. The crystal vibrator according to claim 6, wherein the extension electrode is disposed on an entire surface of the tapered lateral surface, and has a width larger than a width of the tapered lateral surface so as to extend to a portion of the first edge side lateral surface and to a portion of the second edge side lateral surface of the vibration portion.

8. The crystal vibrator according to claim 1,
wherein the vibration portion has a second edge side lateral surface abutting the peripheral portion at a second side of the AT-cut crystal substrate that extends in a direction perpendicular to the first side of the AT-cut crystal substrate, and
wherein the second edge side lateral surface abuts the peripheral portion at an angle θ2 that is larger than the angle θ'.

9. The crystal vibrator according to claim 8, wherein the angle θ2 is in a range of 85°<θ2<95°.

10. The crystal vibrator according to claim 1,
wherein the AT-cut crystal substrate has a front surface and a rear surface, and
wherein an external shape of the vibration portion on the front surface is axially symmetrical to an external shape of the vibration portion on the rear surface about the Z' axis in the view of the plane defined by the X axis and the Z' axis.

11. A crystal vibration device, comprising:
a base member;
a lid member connected to the base member to form a hermetically sealed inner space; and
a crystal vibrator housed in the inner space, the crystal vibrator comprising:
an AT-cut crystal substrate including a crystallographic axes including an X axis, a Y axis, and a Z axis and having a Z' axis that is obtained by rotating the Z axis around the X axis by a predetermined angle greater than 0°, the AT-cut crystal substrate having a principal surface that is parallel to a plane defined by the X axis and the Z' axis;
an excitation electrode disposed on the principal surface of the AT-cut crystal substrate; and
an extension electrode electrically connected to the excitation electrode,
wherein the AT-cut crystal substrate includes a vibration portion and a peripheral portion surrounding the vibration portion and having a thickness less than the vibration portion,
wherein the AT-cut crystal substrate has a longitudinal direction parallel to the Z'-axis direction and a transverse direction parallel to the X-axis direction,
wherein the vibration portion has a first edge side lateral surface abutting the peripheral portion at an acute angle θ1 at a first side of the AT-cut crystal substrate, and a tapered lateral surface adjacent to the first edge side lateral surface and angled relative to the X axis in a view of the plane defined by the X axis and the Z' axis,
wherein the tapered lateral surface abuts the peripheral portion at an angle θ' that is larger than the acute angle θ1, and
wherein the extension electrode extends from the excitation electrode and is disposed on at least a portion of the tapered lateral surface extending to the first side of the AT-cut crystal substrate.

12. The crystal vibration device according to claim 11, wherein the extension electrode is disposed on an entire surface of the tapered lateral surface, and has a width larger than a width of the tapered lateral surface so as to extend to at least a portion of the first edge side lateral surface.

13. The crystal vibration device according to claim 11,
wherein the vibration portion has a second edge side lateral surface abutting the peripheral portion at a second side of the AT-cut crystal substrate that extends in a direction perpendicular to the first side of the AT-cut crystal substrate, and
wherein the second edge side lateral surface abuts the peripheral portion at an angle θ2 that is larger than the angle θ'.

14. The crystal vibration device according to claim 13, wherein θ1 is between 33° and 38°, θ' is between 50° and 80°, and θ2 is between 85° and 95°.

15. The crystal vibration device according to claim 11,
wherein the AT-cut crystal substrate has a front surface and a rear surface, and
wherein an external shape of the vibration portion on the front surface is axially symmetrical to an external shape of the vibration portion on the rear surface about the Z' axis in the view of the plane defined by the X axis and the Z' axis.

16. A crystal vibrator, comprising:
an AT-cut crystal substrate including a crystallographic axes having an X axis, a Y axis, a Z axis and a Z' axis that is obtained by rotating the Z axis of the AT-cut crystal substrate around the X axis by a predetermined angle, wherein the AT-cut crystal substrate has a principal surface parallel to a plane defined by the X axis and the Z' axis;
an excitation electrode disposed on the principal surface of the AT-cut crystal substrate; and
an extension electrode electrically connected to the excitation electrode,
wherein the AT-cut crystal substrate includes a vibration portion and a peripheral portion that surrounds the vibration portion and has a thickness less than the vibration portion,
wherein the AT-cut crystal substrate is rectangular shaped with a first pair of opposing sides extending in a first direction parallel to the X-axis direction and a second pair of opposing extending in a second direction parallel to the Z'-axis direction and perpendicular to the first direction,
wherein the vibration portion has a first lateral side surface that abuts the peripheral portion at an angle θ1 at one side of the first pair of opposing sides of the AT-cut crystal substrate,
wherein the vibration portion has a second lateral side surface that abuts the peripheral portion at an angle θ2 at one side of the second pair of opposing sides of the AT-cut crystal substrate,
wherein the vibration portion has a tapered lateral surface between the first and second lateral side surfaces, the tapered lateral surface abutting the peripheral portion at an angle θ', wherein θ1<θ'<θ2, and
wherein the extension electrode extends from the excitation electrode and is disposed on at least a portion of the tapered lateral surface of the vibration portion.

17. The crystal vibrator according to claim 16, wherein the extension electrode is disposed on an entire surface of the tapered lateral surface, and has a width larger than a width of the tapered lateral surface so as to extend to at least a portion of the first edge side lateral surface and a portion of the second lateral side surface.

18. The crystal vibrator according to claim 16, wherein θ1 is between 33° and 38°, θ' is between 50° and 80°, and θ2 is between 85° and 95°.

19. The crystal vibrator according to claim 16,
wherein the AT-cut crystal substrate has a front surface and a rear surface, and
wherein an external shape of the vibration portion on the front surface is axially symmetrical to an external shape of the vibration portion on the rear surface about the Z' axis in the view of the plane defined by the X axis and the Z' axis.

20. The crystal vibrator according to claim 16, wherein the predetermined angle is 35°15'.

* * * * *